(12) United States Patent
Apel et al.

(10) Patent No.: US 10,008,661 B2
(45) Date of Patent: Jun. 26, 2018

(54) PIEZOCERAMIC LEAD-FREE MATERIAL

(75) Inventors: Friederike Apel, Rueckersdorf (DE); Hans-Juergen Schreiner, Hersbruck (DE); Claudia Voigt, Grossschirma (DE)

(73) Assignee: CeramTec GmbH, Plochingen (DE)

( * ) Notice: Subject to any disclaimer, the term of this patent is extended or adjusted under 35 U.S.C. 154(b) by 496 days.

(21) Appl. No.: 14/125,514

(22) PCT Filed: Jun. 29, 2012

(86) PCT No.: PCT/EP2012/062721
§ 371 (c)(1),
(2), (4) Date: Dec. 11, 2013

(87) PCT Pub. No.: WO2013/004622
PCT Pub. Date: Jan. 10, 2013

(65) Prior Publication Data
US 2014/0120032 A1    May 1, 2014

(30) Foreign Application Priority Data

Jul. 1, 2011   (DE) .................. 10 2011 078 536

(51) Int. Cl.
| | |
|---|---|
| *H01L 41/187* | (2006.01) |
| *C04B 35/462* | (2006.01) |
| *C04B 35/475* | (2006.01) |
| *C04B 35/626* | (2006.01) |
| *C01G 29/00* | (2006.01) |
| *H01L 41/43* | (2013.01) |

(52) U.S. Cl.
CPC ........ *H01L 41/1873* (2013.01); *C01G 29/006* (2013.01); *C04B 35/462* (2013.01); *C04B 35/475* (2013.01); *C04B 35/6261* (2013.01); *C04B 35/62685* (2013.01); *H01L 41/187* (2013.01); *H01L 41/43* (2013.01); *C01P 2006/80* (2013.01); *C04B 2235/3201* (2013.01); *C04B 2235/3298* (2013.01); *C04B 2235/652* (2013.01); *C04B 2235/656* (2013.01); *C04B 2235/72* (2013.01); *C04B 2235/79* (2013.01)

(58) Field of Classification Search
CPC . C04B 35/475; C04B 35/462; C04B 35/6261; C04B 35/62685; C04B 2235/3201; C04B 2235/3298; C04B 2235/652; C04B 2235/656; C04B 2235/72; C04B 2235/79; H01L 41/18; H01L 41/43; H01L 41/187; H01L 41/1873; C01G 29/006; C01P 2006/80
See application file for complete search history.

(56) References Cited

U.S. PATENT DOCUMENTS

| | | | | |
|---|---|---|---|---|
| 2008/0138272 A1* | 6/2008 | Ohmori | ............... | B01J 13/0047 423/622 |
| 2008/0237530 A1* | 10/2008 | Tsukada | ............... | C04B 35/462 252/62.9 PZ |
| 2011/0221828 A1* | 9/2011 | Sakai | .................... | B41J 2/1612 347/68 |
| 2011/0291522 A1 | 12/2011 | Kounga Njiwa et al. | | |

FOREIGN PATENT DOCUMENTS

| | | | | |
|---|---|---|---|---|
| CN | 101913868 A | | 12/2010 | |
| EP | 2 113 495 A2 | | 11/2009 | |
| JP | 62128923 A | * | 6/1987 | |
| KR | 20040090258 | * | 10/2004 | ............. C01G 23/04 |

OTHER PUBLICATIONS

JP62128923, machine translation of description, abstract, and drawings.*
KR20040090258, machine translation of description and abstract.*
JP6099153, machine translation, Kamihira.*
Nagata et al (NPL: "Large Piezoelectric Constant and High Curie Temperature of Lead-Free Piezoelectric Ceramic Ternary System based on Bismuth Sodium Titanate- Bismuth Potassium Titanium-Barium Titanate near the Morphotropic Phase Boundary", J. Appl. Phys. vol. 42 (2003) pp. 7401-7403).*

* cited by examiner

*Primary Examiner* — Melvin C. Mayes
*Assistant Examiner* — Smita S Patel
(74) *Attorney, Agent, or Firm* — Norton Rose Fulbright US LLP

(57) ABSTRACT

The invention relates to a piezoelectric lead-free material based on bismuth sodium titanate, to a method for the production thereof, and to the use thereof.

8 Claims, No Drawings

PIEZOCERAMIC LEAD-FREE MATERIAL

FIELD OF THE INVENTION

This application is a § 371 of International Application No. PCT/EP2012/062721 filed Jun. 29, 2012, and claims priority from German Patent Application No. 10 2011 078 536.1 filed Jul. 1, 2011.

The present invention relates to a piezoelectric lead-free material based on bismuth sodium titanate, a method for its production, and use thereof.

BACKGROUND OF THE INVENTION

Piezoelectric ceramics (piezoceramics) have a broad field of application in the areas of sensors (measuring forces, accelerations, and pressures) and actuators (positioning technology and ultrasound generation).

The use of piezoceramics, in particular in automotive technology (knock sensors, yaw rate sensors, parking sensors), requires materials having high piezoelectric activity with thermal and temporal stability (high Curie temperature, low temperature coefficients, and low aging rates) of the functional parameters.

For quite some time, piezoceramic materials have been made of compositions based on solid solutions (mixed crystals) of lead zirconate ($PbZrO_3$) and lead titanate ($PbTiO_3$). Numerous modifications of the base system are possible by substitution and/or addition of metal ions in limited concentrations when the ions in question meet requirements regarding valence, ionic radius, and character of the chemical bond.

Modification of the base composition by doping with ions having a different valence from the original ions results in diversification of the dielectric and electromechanical properties.

As a substitute for lead zirconate titanate ceramics, under certain conditions compounds having a perovskite structure, such as $BiFeO_3$, $KNbO_3$, $NaNbO_3$, and $Na_{0.5}Bi_{0.5}TiO_3$, may be used.

These piezoceramics belong to the ferroelectrics. Lead-free compositions such as $(K,Na)NbO_3$ and $(Sr_{1-x}Ba_x)Nb_2O_5$ are also known as ceramic ferroelectrics, but they do not achieve the properties of known PZT-based systems.

On the whole, with the various modifications of the base systems, a large variety of compositions already exist, by means of which in many cases it has been possible to achieve a particular application-oriented specification of the dielectric and electromechanical properties of piezoelectric materials for various converter functions.

One disadvantage of the known lead zirconate titanate ceramics is the lead oxide used as the main component, specifically, $Pb^{2+}$ which is solidly bound in the perovskite lattice. Therefore, due to the poor environmental compatibility of lead oxide, lead-free piezoceramics should preferably be used in the future. One promising system in the area of lead-free systems is the $Bi_{0.5}Na_{0.5}TiO_3$ system (bismuth sodium titanate (BNT)). However, even this system has some drawbacks:

Due to the solubility of sodium carbonate in water and the resulting homogeneity problems during production of bismuth sodium titanate, ethanol is used as solvent. As a result, requirements for working with explosive materials as well as environmental standards must be met, which entails fairly complicated methods and costly equipment. The benefits gained by the use of lead-free systems are partly offset by these additional constraints.

Furthermore, in the sintering of bismuth sodium titanate there is the problem that oxygen vacancies develop, thus increasing the conductivity of the material and making polarization more difficult.

OBJECTS OF THE INVENTION

The object of the present invention, therefore, is to provide a lead-free piezoceramic material in the bismuth sodium titanate system which has minimal oxygen vacancies, and which can be produced in an aqueous system.

The control over the formation of oxygen vacancies in the process thus represents an important feature of the method according to the invention.

SUMMARY OF THE INVENTION

The object of the invention is achieved by the present invention which is a lead-free piezoceramic material and production thereof features. Advantageous embodiments are described herein.

DETAILED DESCRIPTION

Accordingly, a method according to the invention provides for the production of a piezoceramic lead-free material composed of bismuth sodium titanate, sodium bismuthate ($NaBiO_3$) being used as the sodium and bismuth source.

A stoichiometric compound is present in the $Bi_{0.5}^{3+}Na_{0.5}^{1+}Ti^{4+}O_3^{2-}$ (BNT) system. Oxygen vacancies may be created by foreign substances, i.e., impurities, or also by the calcination and sintering processes. This is prevented by the use of $Na^{1+}Bi^{5+}O_3^{2-}$. In this compound, the oxygen concentration is higher compared to BNT, and is liberated during sintering due to the reduction of $Bi^{5+}$ to $Bi^{3+}$.

Thus, the sintering advantageously takes place in an oxygen-rich environment which prevents/minimizes, or in any case significantly reduces, the development of oxygen vacancies.

As a result, the sintering temperature may be lowered by as much as 50° C. A farther distance from the melting temperature, which may be approximately 1250° C., is thus provided. The method is therefore also more energy-efficient as the result of lowering the process temperature.

According to one preferred refinement of the invention, the precursors of the piezoceramic material is mixed and ground in an aqueous system. This has the advantage that requirements for working with explosive materials do not apply, since ethanol is not used as solvent.

Environmental standards concerning the lead content of PZT ceramics also do not apply due to the fact that the lead content is minimized; the content of lead is particularly preferably below 0.1 mass-%.

A piezoceramic lead-free material according to the invention may be used, for example, in the area of sensors, in particular for measuring forces, accelerations, and pressures, and in the area of actuators, in particular positioning technology and ultrasound generation.

It is claimed:

1. A method for producing a piezoceramic lead-free bismuth sodium titanate comprising the steps of:
   mixing and grinding sodium bismuthate and a titanium source in water to form a mixture; and
   sintering the mixture to form the piezoceramic lead-free bismuth sodium titanate;
   wherein the piezoceramic lead-free bismuth sodium titanate consists of formula $Bi_{0.5}Na_{0.5}TiO_3$.

2. The method of claim 1, wherein the aqueous system comprises water.

3. A method according to claim 1, wherein the sintering takes place in an oxygen-rich environment which prevents, minimizes, or in any case significantly reduces, the development of oxygen vacancies.

4. A method for producing a piezoceramic lead-free bismuth sodium titanate comprising the steps of:
   mixing and grinding sodium bismuthate with a titanium source in an aqueous system to form a mixture; and
   sintering said mixture to form the piezoceramic lead-free bismuth sodium titanate;
wherein said aqueous system comprises water and does not contain an explosive material; and
   wherein the piezoceramic lead-free bismuth sodium titanate consists of formula $Bi_{0.5}Na_{0.5}TiO_3$.

5. The method of claim 4, wherein the explosive material is ethanol.

6. A method according to claim 4, wherein the sintering takes place in an oxygen-rich environment which prevents, minimizes, or in any case significantly reduces, the development of oxygen vacancies.

7. A method for producing a piezoceramic material comprising the steps of:
   mixing and grinding sodium bismuthate with a titanium source in an aqueous system to form a mixture; and
   sintering said mixture to form the piezoceramic material;
   wherein said aqueous system comprises water and does not contain an explosive material;
   wherein the piezoceramic material has a lead content below 0.1-mass-%; and
   wherein the piezoceramic material consists of formula $Bi_{0.5}Na_{0.5}TiO_3$.

8. A method according to claim 7, wherein the sintering takes place in an oxygen-rich environment which prevents, minimizes, or in any case significantly reduces, the development of oxygen vacancies.

* * * * *